United States Patent [19]

Longsderff et al.

[11] 4,233,936
[45] Nov. 18, 1980

[54] ALKALI METAL DISPENSER

[75] Inventors: Richard W. Longsderff; Dale V. Henry, both of Lancaster, Pa.

[73] Assignee: RCA Corporation, New York, N.Y.

[21] Appl. No.: 37,117

[22] Filed: May 8, 1979

[51] Int. Cl.³ .......................... B44D 1/02; C23D 1/02
[52] U.S. Cl. ..................................... 118/726; 219/275
[58] Field of Search ................ 118/726; 219/271, 275; 239/60, 57

[56] References Cited

U.S. PATENT DOCUMENTS 3,344,768  10/1967  Jenning ................................ 118/726

Primary Examiner—Sam Silverberg
Attorney, Agent, or Firm—Eugene M. Whitacre; Glenn H. Bruestle; Vincent J. Coughlin, Jr.

[57] ABSTRACT

An alkali metal dispenser in an electron tube for vapor depositing alkali metals on photoemissive surface within the tube envelope comprises a non-welded-tubular housing having walls formed by spirally rolling upon itself a thin sheet of tantalum so that the walls spirally overlap, preferably twice. The "double wrapped" dispenser prevents uncontrollable escape of alkali particles contained within the interior of the tubular housing and provides a substantially uniform orifice for repeatable release of alkali vapors.

5 Claims, 4 Drawing Figures

ALKALI METAL DISPENSER

BACKGROUND OF THE INVENTION

1. Field of the Invention

This invention relates to an alkali metal dispenser useful in electron tubes for vapor deposition of an alkali material onto a photoemissive surface within the tube.

2. Description of the Prior Art

The deposition of alkali metal vapors for the sensitization of photocathodes in photomultiplier tubes, camera tubes and other electron tubes having photoemissive surfaces is often accomplished by alkali dispensers or evaporators mounted within the tube near the photocathode surface. The known alkali dispensers typically comprises a metal holder which contains a mixture of a chromate or bichromate of a relevant alkali metal and a reducing agent. The holder is generally made of a relatively thin metal sheet that is rolled into a substantially cylindrical container having a slight overlap as shown, for example, in U.S. Pat. No. 3,945,949, issued on Mar. 23, 1976. The overlapping portions of such a container is often spot welded at spaced intervals along the overlap as described in U.S. Pat. No. 3,372,967, issued on Mar. 12, 1968 and U.S. Pat. No. 3,644,101, issued on Feb. 22, 1972. A wire lead is generally attached to each end of the container to pass current through the container for heating the alkali compound. The resulting alkali vapor escapes through the seam between the weld spots into the cathode area.

One of the major problems encountered with these known alkali dispensers is the uncontrollable escape of alkali metal particles. Large number of welds typically provides poor integrity of the alkali metal container often resulting in open welds that undesirably allow escape of alkali metal particles. Also, due to variation in welding, repeatedly depositing consistent amounts of alkali metal is extremely difficult to achieve. In addition, tantalum, the most attractive housing material, is difficult to spot-weld, often resulting in marginal welds and hence reduced reliability. Lastly, the welding operation is skill dependent resulting in a relatively costly package.

SUMMARY OF THE INVENTION

An alkali dispenser is provided for vapor depositing an alkali material onto an interior portion of an electron tube envelope in the production of a photocathode. The dispenser comprises a non-welded tubular housing of a sheet of thin deformable metal spirally rolled upon itself to provide a double walled structure for a substantial portion of the cylindrical circumference. The tubular housing is enclosed at both ends.

DESCRIPTION OF THE PREFERRED EMBODIMENT

Figure 1:
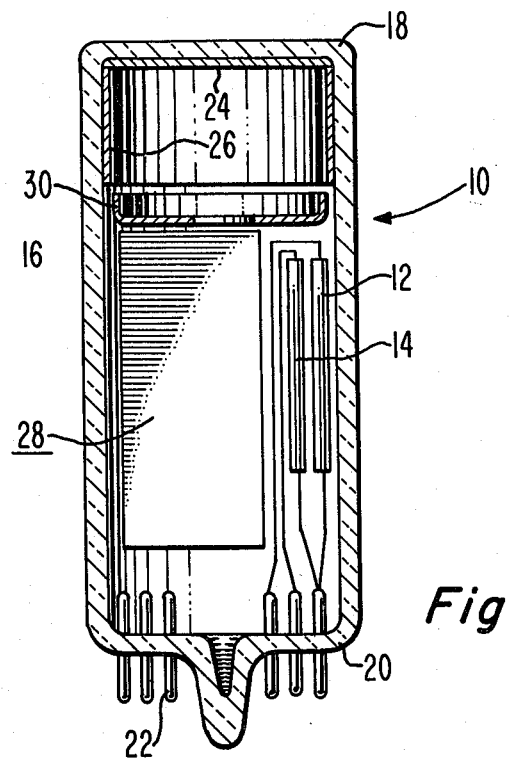
FIG. 1 is a longitudinal view, partly in section, of a photomultiplier tube, having, for example, a pair of novel alkali metal dispensers.

Referring to the drawing, there is shown in FIG. 1 a photomultiplier tube 10 including a pair of novel alkali metal dispensers 12 and 14, respectively. It should be understood that the photomultiplier tube 10 depicted herein is utilized for illustrative purposes and that any electron tube incorporating a photoemissive surface may also be used.

The tube 10 comprises an envelope 16 of generally cylindrical form having a transparent faceplate 18 on one end and a stem 20 on the other end through which a plurality of conductive contact pins 22 extend.

A photocathode 24 is formed on the inner surface of the faceplate 18, the photocathode 24 preferably comprising antimony and cesium although other suitable materials may be employed to form a photoemissive surface. A conductive coating 26 is deposited on the upper portion of the inner surface of the envelope 16, the coating 26 being in electrical contact with the photocathode 24. Along the interior of the envelope 16 is disposed a dynode assembly, designated generally as numeral 28, to receive photoelectrons produced by the photocathode 24 in response to incident light. The dynode assembly 28 may be in any desirable configuration, such as serially aligned box-type dynodes. For purposes of clarity, the dynodes are not shown in FIG. 1 since they form no part of the present invention. An electrode shield 30 is disposed between the photocathode 24 and the dynode assembly 28.

Near the dynode assembly 28 are the two alkali metal dispensers 12 and 14 that are used to evaporate alkali metals such as sodium and potassium onto the photocathode 24 so as to sensitize the photocathode at desirable spectral sensitivities. The dispensers may also be used to deposit an alkali material in the production of the photocathode. It should be noted that although two dispensers 12 and 14 are shown, any suitable number may be utilized in the practice of the invention. Each of the dispensers contains a suitable alkali compound and a reducing agent. For example, a potassium dispenser may contain potassium chromate, aluminum and tungsten. The dispensers 12 and 14 are suitably connected as by internal leads to electrical current sources (not shown) through the pins 22 so that an electrical current can be independently passed through the dispensers 12 and 14. The current heats the dispensers 12 and 14 by electrical resistance, vaporizing the alkali compound, which vapors are then released to the photocathode area.

Figure 2A:
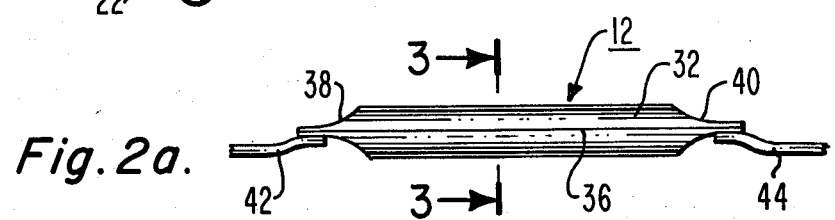
FIGS. 2(a) and 2(b) are elevation views of two embodiments respectively of the novel alkali metal dispenser.
Figure 3:
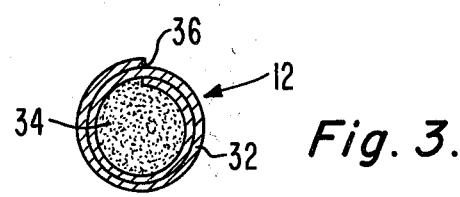
FIG. 3 is a sectional view of the dispenser of either FIG. 2(a) or 2(b) as seen along viewing lines 3—3.

A preferred embodiment of the novel dispenser 12 is shown in FIGS. 2(a) and 3, the dispenser 14 being of similar construction. Dispenser 12 comprises a hollow housing 32 of substantially tubular form. The dispenser 12 is fabricated from a sheet of relatively thin deformable metal that is wrapped upon itself, as by cold-rolling the sheet on a mandrel, to form a tube wherein the walls spirally overlap. It should be understood as used herein that the term "spiral" means something more than just a slight overlap which has been used in the prior art to form a complete enclosure. In the preferred embodiment, the walls are formed to overlap substantially twice. However, an overlap less than twice and at a minimum of about one and one half overlaps will meet the definition of "spirally" and function as contemplated and described herein.

Because of its good electrical resistivity characteristics, it is preferable that the housing be formed of tantalum. In accordance with the extensive cold-rolling processing, it is preferable that the tantalum sheet have a thickness between 0.0003 to 0.0005 inch (0.00762 to 0.0127 mm) and be "dead" or fully annealed by well known heat treating techniques to assure proper rolling without cracking. The tantalum should also be free of oxides, nitrides and hydrides to prevent any brittleness during the forming operation. Dispensers having an inner diameter of about 1.27 mm and about 10–40 mm long have been fabricated with tantalum as herein described. Although tantalum is the preferred material, other materials having high resistivity and deformability, such as, for example, chromium-nickel-steel, may also be used.

After the tubular housing 32 is formed with the spiral overlap, the interior of the housing 32 is filled with the suitable alkali compound 34 as shown in FIG. 3. In accordance with the spirally overlapped walls, in particular the "doubly wrapped" housing, the alkali particles have a considerably longer and nonlinear path to travel to escape. Hence, the undesirable release of these particles into the tube is miminized considerably, if not eliminated. Also, a substantially uniform orifice impedance is provided at the seam 36 which results in substantial repeatability of the alkali evaporation.

According to one embodiment shown in FIG. 2(a) the ends of the housing 32 are enclosed to contain the alkali compound by crimping both ends 38 and 40 of the housing 32. Conductive leads 42 and 44 may be connected to the crimped ends 38 and 40 respectively to supply the electrical current to the dispenser 12.

Figure 2B:
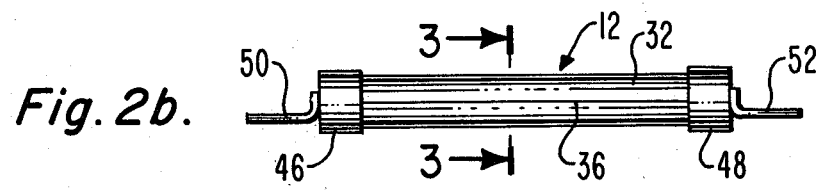

In another embodiment of enclosing the housing 32 as shown in FIG. 2(b), cup-shaped end caps 46 and 48 are bonded to each end of the housing 32. Conductive tabs 50 and 52 are attached to the end caps 46 and 48 respectively so as to supply the electrical current to the dispenser 12.

It should be appreciated that the non-welded, spirally formed dispenser is less expensive to fabricate than those dispensers made by welding. Also, since the welding step is eliminated, any contamination of the alkali metal due to welding mandrels and electrodes is avoided. Thus, the alkali metal vapor deposited is purer than that released with welded-type dispensers.

What is claimed is:

1. An alkali dispenser for vapor depositing an alkali material in the production of a photocathode, said dispenser comprising a non-welded tubular housing of a sheet of thin deformable metal selected from group consisting of tantalum and chromium-nickel-steel spirally rolled upon itself to provide a double walled structure for a substantial portion of the cylindrical circumference thereof, having at a minimum one and one half overlaps, said tubular housing being closed at its two ends.

2. An alkali dispenser according to claim 1, wherein said housing walls spirally overlap substantially twice.

3. An alkali dispenser according to claim 1, wherein said housing is enclosed by a crimped portion of said housing on each end thereof.

4. An alkali dispenser according to claim 1, wherein said housing walls are formed of fully annealed tantalum.

5. An alkali dispenser according to claim 4, wherein the thickness of said tantalum is within the range from 0.0003 to 0.0005 inch (0.00762 to 0.0127 mm).

* * * * *